US012581923B2

(12) United States Patent
Sano et al.

(10) Patent No.: US 12,581,923 B2
(45) Date of Patent: Mar. 17, 2026

(54) METHOD FOR REMOVING EDGE OF SUBSTRATE IN SEMICONDUCTOR STRUCTURE

(71) Applicant: TAIWAN SEMICONDUCTOR MANUFACTURING COMPANY, LTD., Hsinchu (TW)

(72) Inventors: Kenichi Sano, Hsinchu (TW); Chung-Liang Cheng, Hsinchu (TW); De-Yang Chiou, Hsinchu (TW); Kuan-Liang Liu, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 764 days.

(21) Appl. No.: 17/842,169

(22) Filed: Jun. 16, 2022

(65) Prior Publication Data

US 2023/0411141 A1 Dec. 21, 2023

(51) Int. Cl.
| | |
|---|---|
| *H01L 21/02* | (2006.01) |
| *H01L 23/00* | (2006.01) |
| *H10D 30/01* | (2025.01) |
| *H10D 30/43* | (2025.01) |
| *H10D 30/67* | (2025.01) |
| *H10D 62/10* | (2025.01) |

(52) U.S. Cl.
CPC ........ *H01L 21/02021* (2013.01); *H01L 24/27* (2013.01); *H01L 24/32* (2013.01); *H01L 2224/27009* (2013.01); *H01L 2224/32221* (2013.01); *H10D 30/014* (2025.01); *H10D 30/43* (2025.01); *H10D 30/6735* (2025.01); *H10D 30/6757* (2025.01); *H10D 62/121* (2025.01)

(58) Field of Classification Search
CPC ............. H10D 30/014; H10D 30/6757; H10D 62/121; H10D 30/6735; H10D 30/43
See application file for complete search history.

(56) References Cited

U.S. PATENT DOCUMENTS

| | | | | |
|---|---|---|---|---|
| 5,258,323 A | * | 11/1993 | Sarma ................... | H01L 21/764 |
| | | | | 438/164 |
| 5,862,829 A | * | 1/1999 | Sand ..................... | B01F 25/312 |
| | | | | 137/216 |
| 2011/0151644 A1 | * | 6/2011 | Vaufredaz ......... | H01L 21/76256 |
| | | | | 438/459 |
| 2013/0186853 A1 | * | 7/2013 | Sugimoto ............. | G02F 1/1341 |
| | | | | 216/23 |
| 2017/0292796 A1 | * | 10/2017 | Scheibl ................ | B01J 19/0013 |
| 2018/0012754 A1 | * | 1/2018 | Nanba ............... | H01L 21/32134 |
| 2021/0305205 A1 | * | 9/2021 | Hsieh ...................... | H01L 21/78 |
| 2023/0253296 A1 | * | 8/2023 | Or-Bach .............. | H10D 10/051 |
| | | | | 257/499 |

* cited by examiner

*Primary Examiner* — Christine A Enad

(74) *Attorney, Agent, or Firm* — Birch, Stewart, Kolasch & Birch, LLP

(57) ABSTRACT

A method for treating a semiconductor structure includes: forming the semiconductor structure which includes a carrier substrate, a device substrate, a semiconductor device formed on the device substrate, and a bonding layer formed to bond the semiconductor device with the carrier substrate, the device substrate having an upper surface which is faced upwardly, and which is opposite to the semiconductor device; and directing a chemical fluid to impinge the upper surface of the device substrate so as to remove an edge portion of the device substrate.

20 Claims, 11 Drawing Sheets

METHOD FOR REMOVING EDGE OF SUBSTRATE IN SEMICONDUCTOR STRUCTURE

BACKGROUND

In semiconductor device fabrications, wafer edge trimming is a common practice to protect the wafers from damages during subsequent processing of the wafers and/or the semiconductor devices, yet in some cases, the trimming process may undesirably damage the semiconductor devices. In view of this, the industry has put much efforts in developing different wafer edge trimming methods that provide better protection to the wafers and the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
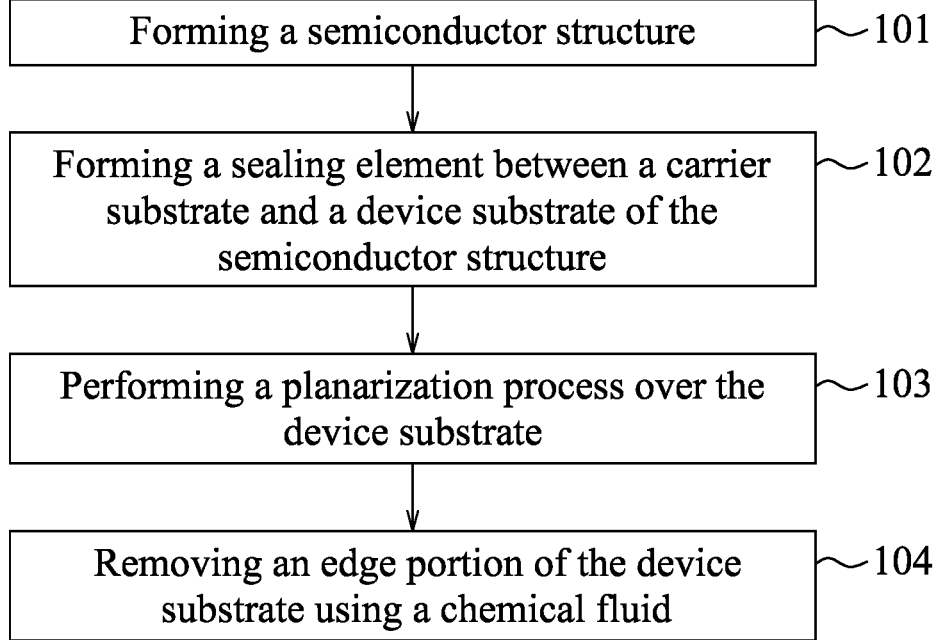
FIG. 1 is a flow diagram illustrating a method for treating a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "upper," "lower," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a method for treating a semiconductor structure, in which the treatment includes removing an edge portion of a device substrate, thereby obtaining a treated semiconductor structure. The semiconductor structure may be formed by bonding a semiconductor device on a device substrate to a carrier substrate, and by the method described thereafter, the semiconductor device originally formed on the device substrate can be transferred to the carrier substrate.

FIG. 1 is a flow diagram illustrating the method for treating the semiconductor structure in accordance with some embodiments. FIGS. 2 to 6B illustrate schematic views of the intermediate stages of the method in accordance with some embodiments. Some portions in FIGS. 2 to 6B are omitted for the sake of brevity. Additional steps can be provided before, after or during the method, and some of the steps described herein may be replaced by other steps or be eliminated.

Figure 2:
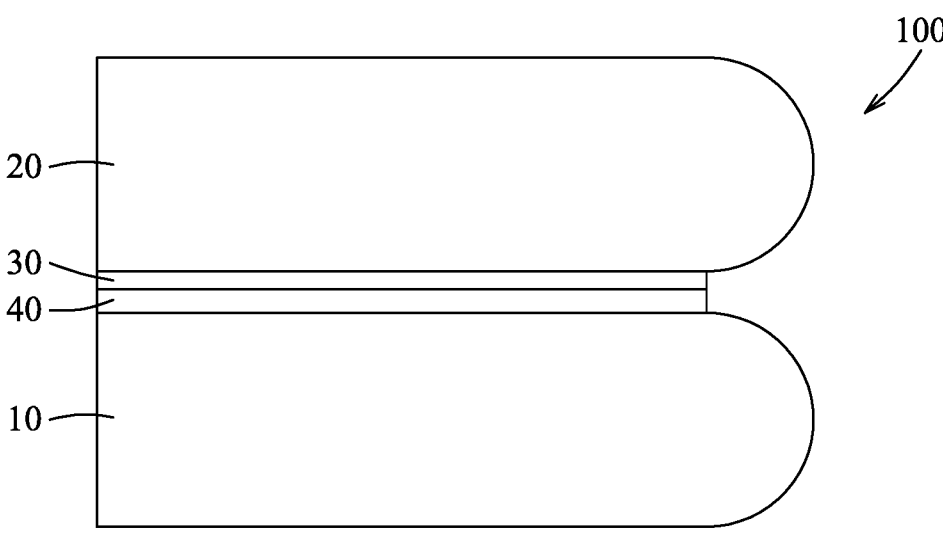
FIGS. 2 to 9E are schematic views illustrating intermediate stages of the method for treating the semiconductor structure in accordance with some embodiments.

Referring to FIG. 1 and the example illustrated in FIG. 2, the method begins at step 101, where a semiconductor structure 100 is formed. FIG. 2 is an enlarged schematic view of the semiconductor structure 100 in accordance with some embodiments. The semiconductor structure 100 includes a carrier substrate 10, a device substrate 20, a semiconductor device 30 formed on the device substrate 20, and a bonding layer 40 that bonds the semiconductor device 30 with the carrier substrate 10. The device substrate 20 has a proximate surface and a distal surface relative to the carrier substrate 10.

Each of the carrier substrate 10 and the device substrate 20 may independently include, for example, but not limited to, elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. In addition, each of the carrier substrate and the device substrate 20 may be a bulk silicon substrate, a silicon-on-insulator (SOI) substrate, or a germanium-on-insulator (GOI) substrate. Other suitable materials for the carrier substrate 10 and the device substrate 20 are within the contemplated scope of the present disclosure. In some embodiments, each of the carrier substrate 10 and the device substrate 20 includes silicon.

In some embodiments, the carrier substrate 10 and the device substrate 20 may be independently doped by a dopant. In certain embodiments, the dopant is a p-type impurity, for example, but not limited to boron. Other suitable impurities for doping the carrier substrate 10 and/or the device substrate 20 are within the contemplated scope of the present disclosure.

In certain embodiments, the carrier substrate 10 may have a dopant concentration substantially the same as that of the device substrate 20. In other embodiments, the carrier substrate 10 may have a dopant concentration different from that of the device substrate 20. In some embodiments, the device substrate 20 has a dopant concentration higher than that of the carrier substrate 10. Such difference in dopant concentration may facilitate step 104 to be conducted subsequently, and will be further discussed hereinafter.

In some embodiments, the device substrate 20 and/or the carrier substrate 10 may each be a 12-inch, or 8-inch wafer. It should be noted that other suitable sizes of the device substrate 20 and/or the carrier substrate 10 are within the contemplated scope of the present disclosure.

Figure 9A:
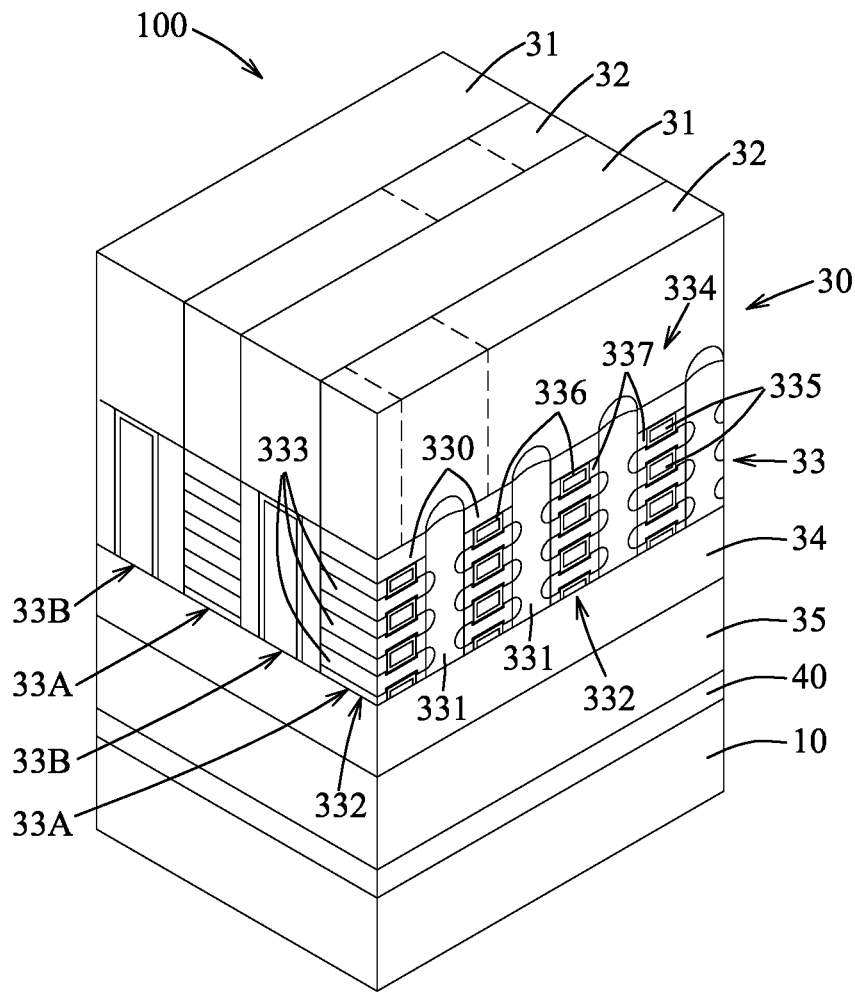

The semiconductor device 30 may include a front-end-of-line (FEOL) portion formed on the device substrate 20 and including, for instance, a logic circuitry with transistors, a memory circuitry having memory elements, passive elements, and/or other suitable elements; a middle-end-of-line (MEOL) portion formed on the FEOL portion and including, for example, metal contacts to be electrically connected to electrodes of the elements in the FEOL portion (for example, but not limited to, gate, source, and drain electrodes of the transistors), interlayer dielectric (ILD) layers among the metal contacts, and or other suitable elements; and a back-end-of-line (BEOL) portion formed on the MEOL portion and including metallization layers (metal lines or vias) formed to electrically connect the metal contacts with an external circuitry out of the semiconductor device 30, and additional ILD layers among the metallization layers. The semiconductor device 30 may be formed using any appropriate materials and/or methods. The semiconductor device 30 may be any desired semiconductor device, for instance, but not limited to, gate-all around (GAA) nanosheet structure device as shown in FIG. 9A. The semiconductor device 30 may have a predetermined size and thickness according to layout of the design. In some embodiments, the semiconductor device 30 has a thickness ranging from about 1 μm to about 3 μm.

Within the semiconductor device 30, some of the metal components, for instance, the metal contacts, or the metal lines that are made of, e.g., copper, may undesirably cause contamination to other components of the semiconductor device 30, therefore, it is important to avoid exposing these metal components in steps to be performed subsequently. In addition, within the semiconductor device 30, some other components, for instance, dielectric layers that are made of low k materials, are liable to any dry etching process performed in further processing of the semiconductor structure 100, therefore, it is also important to avoid exposing these low k materials in steps to be performed subsequently.

The bonding layer 40 is formed to bond the semiconductor device 30 with the carrier substrate 10. The bonding layer 40 may have a thickness ranging from about 250 Å to about 1 μm. In some embodiments, the bonding layer 40 is an oxide-oxide bonding layer, i.e., each of the semiconductor device 30 and the carrier substrate 10 is first formed with, for instance, a silicon dioxide layer. The silicon dioxide layer of each of the semiconductor device 30 and the carrier substrate 10 is then subjected to a plasma treatment to break Si—O—Si bond within silicon dioxide into Si—O bonds, followed by rinsing with water to create a plurality of hydrogen bonds among water molecules and O atom of Si—O bonds. The two silicon dioxide layers are then aligned and brought close to each other so as to bond with each other through Si—O—Si covalent bonds. An annealing process is then performed so as to remove water molecules. As such, the two silicon dioxide layers cooperate to form the bonding layer 40. Other suitable materials and/or processes for forming the bonding layer 40 are within the contemplated scope of the present disclosure.

Figure 3:
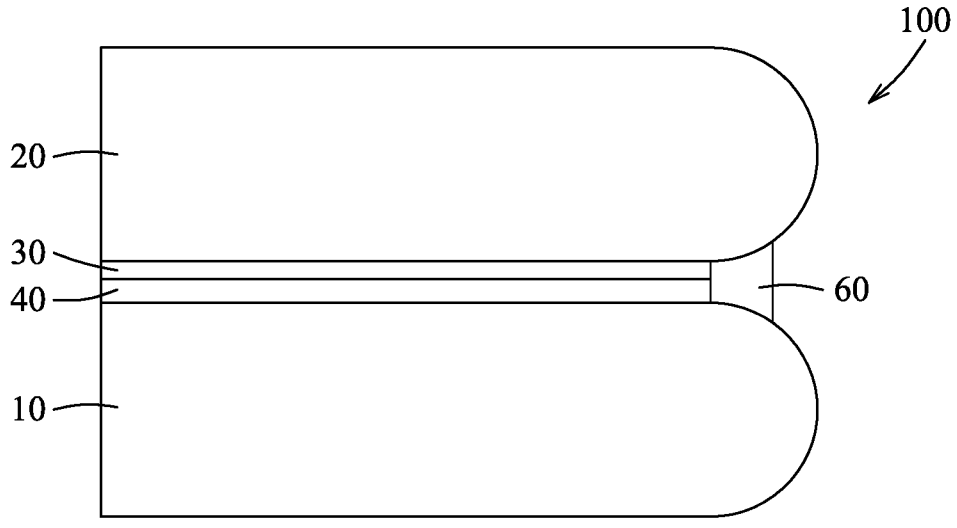

Referring to FIG. 1 and the example illustrated in FIG. 3, the method proceeds to step 102, where a sealing element 60 is formed at a void that is positioned between the carrier substrate 10 and the device substrate 20 and that surrounds the semiconductor device 30 and the bonding layer 40. In some embodiments, the semiconductor structure 100 is first set to rotate, then a sealing element material which is to form the sealing element 60 is applied around the semiconductor device 30 and the bonding layer 40, thereby forming the sealing element 60 that fills the void between the carrier substrate and the device substrate 20. Example of the sealing element material is, for example, but not limited to, epoxy. Other suitable materials or processes for forming the sealing element 60 are within the contemplated scope of the present disclosure. The sealing element 60 is formed to avoid chipping of edge of the device substrate 20.

Figure 4:
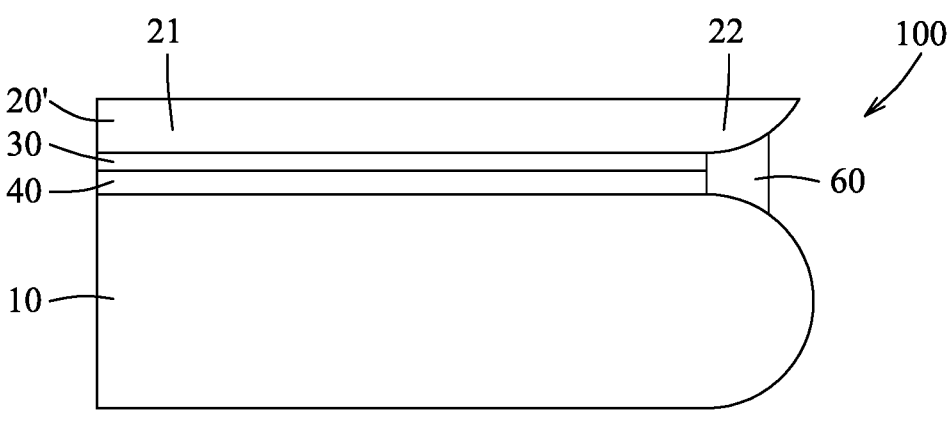

Referring to FIG. 1 and the example illustrated in FIG. 4, the method proceeds to step 103, where the distal surface of the device substrate 20 shown in FIG. 3 is subjected to a planarization process. Step 103 is performed to reduce a thickness of the device substrate 20. By performing the planarization process, the planarized device substrate, denoted by the numeral 20', has a planarized surface opposite to the proximate surface. In some embodiments, the planarization process is a grinding process performed using, for instance, but not limited to, a metal grinding blade. Other suitable processes or devices for performing the planarization process are within the contemplated scope of the present disclosure. In some embodiments, during the grinding process, a thickness of the planarized device substrate 20' is optically examined by, for instance, but not limited to, a laser system. The grinding process stops when the planarized device substrate 20' remaining in the semiconductor structure 100 is confirmed to have a predetermined thickness. In some embodiments, the predetermined thickness may range from about 3 μm to about 50 μm. Other suitable methods for examining and monitoring the thickness of the planarized device substrate 20' are within the contemplated scope of the present disclosure.

After step 103, the planarized device substrate 20' is said to have an upper surface opposite to the proximate surface. That is, the upper surface is faced upwardly, and is opposite to the semiconductor device 30. In addition, the planarized device substrate 20' is said to include a main portion 21, and an edge portion 22 surrounding the main portion 21.

Figure 5A:
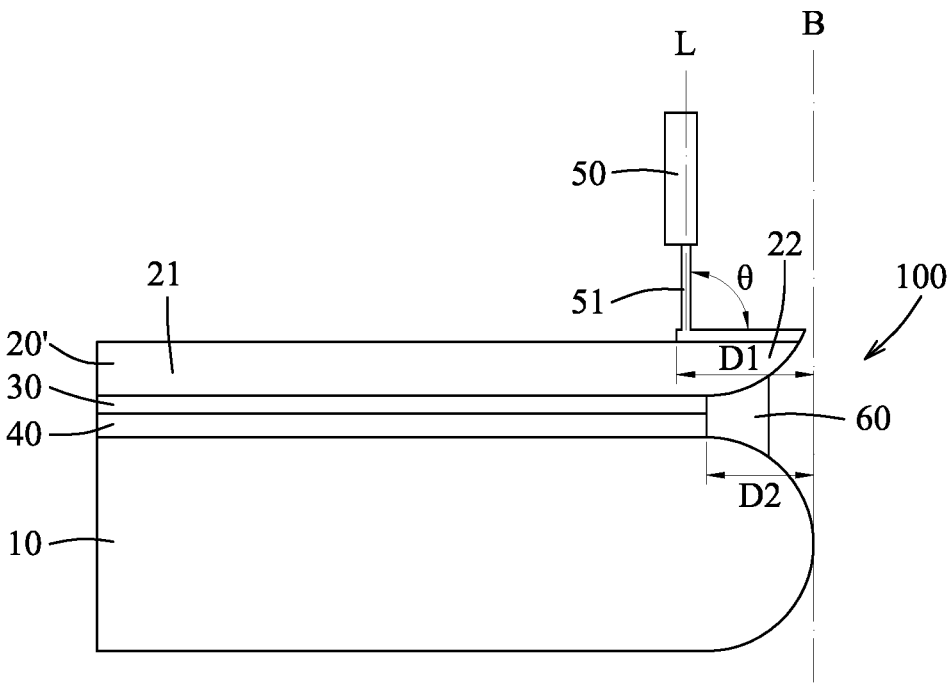
Figure 5B:
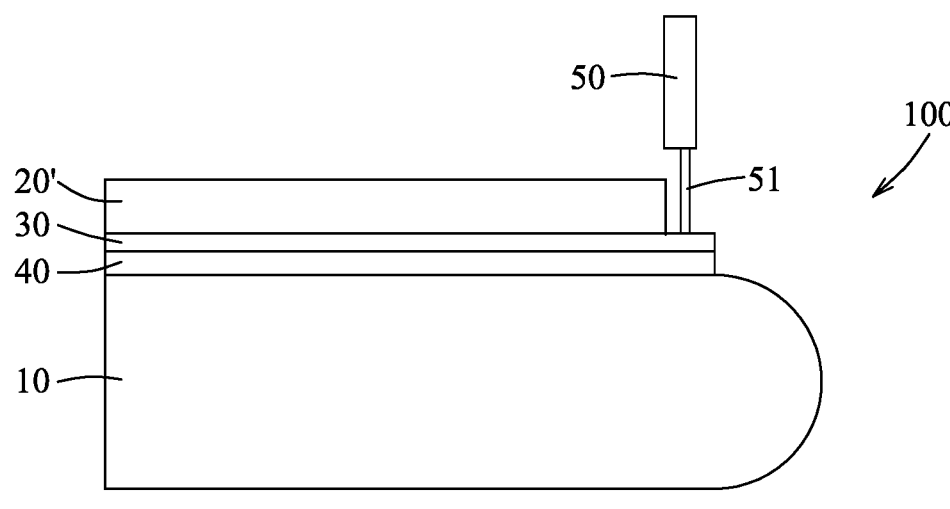
Figure 5C:
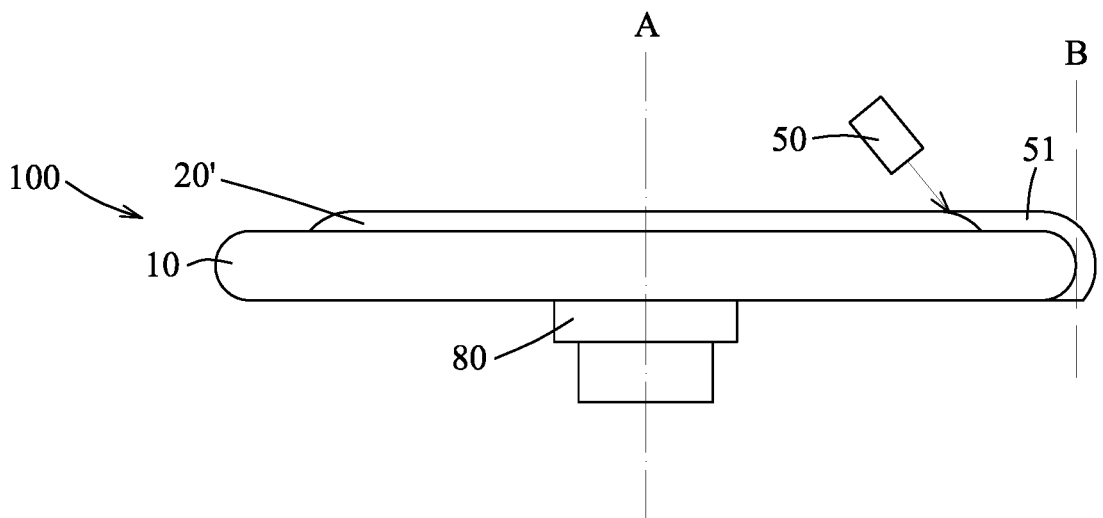

Referring to FIG. 1 and the examples illustrated in FIGS. 5A to 5C, the method proceeds to step 104, where the edge portion 22 of the device substrate 20' is removed using a chemical fluid 51. FIGS. 5A and 5B are enlarged schematic views respectively illustrating the semiconductor structure 100 prior to and after performing intermediate step 104, while FIG. 5C is a schematic view illustrating the semiconductor structure 100 being retained onto a structure retainer 80.

In some embodiments, step 104 includes the sub-steps of: (i) retaining the semiconductor structure 100 on the structure retainer 80 in a manner that the planarized device substrate 20' is faced upwardly; (ii) rotating the semiconductor structure 100 with the structure retainer 80; (iii) directing the chemical fluid 51 through a nozzle 50 so as to impinge and etch a peripheral region of the planarized upper surface of the device substrate 20'; (iv) rinsing the etched semiconductor structure 100 with deionized water; and (v) drying the etched semiconductor structure 100. During sup-steps (iii) to (v), sub-step (ii) is also performed simultaneously.

In sub-step (i), the semiconductor structure is centrally positioned on the structure retainer 80, with the planarized upper surface of the device substrate 20' facing upward. Examples of the structure retainer 80 are a vacuum chuck and an electrostatic chunk. Other devices suitable for holding the semiconductor structure 100 are within the contemplated scope of the present disclosure.

In sub-step (ii), in some embodiments, the semiconductor structure 100 is rotated at a rotational speed ranging from about 30 revolutions per minute (rpm) to about 1500 rpm, for example, but not limited to, 1200 rpm. The semiconductor structure 100 is rotated about a rotation axis (A) normal to the planarized upper surface of the device substrate 20'.

In sub-step (iii), the nozzle 50 is precisely positioned, so that the chemical fluid 51 is directed to reach the peripheral region of the planarized upper surface of the device substrate 20'. In some embodiments, the nozzle 50 is positioned to satisfy the following descriptions. As shown in FIGS. 5A and 5C, there is an imaginary reference line (B) which is tangent to an edge of the carrier substrate 10, and which is parallel to the rotational axis (A). A first distance (D1) is a distance between the reference line (B) and a point on the device substrate 20' at which the chemical fluid 51 reaches the device substrate 20' from the nozzle 50. In some embodiments, the first distance (D1) ranges from about 0.7 mm to about 5 mm. In addition, a second distance (D2) is a minimal distance between the semiconductor device 30 and the reference line (B). In some embodiments, the second distance (D2) ranges from about 0.5 mm to about 4.8 mm, such as, but not limited to, 0.5 mm. In some embodiments, the first distance (D1) is greater than the second distance (D2). In some embodiments, the difference between the first and second distances (D1 and D2) ranges from about 0.2 mm to about 4.5 mm. In some embodiments, the peripheral region (that is to be etched away by the chemical fluid 51) is the device substrate 20' located within the first distance (D1) from the imaginary reference line (B).

Figures 5D, 5E:
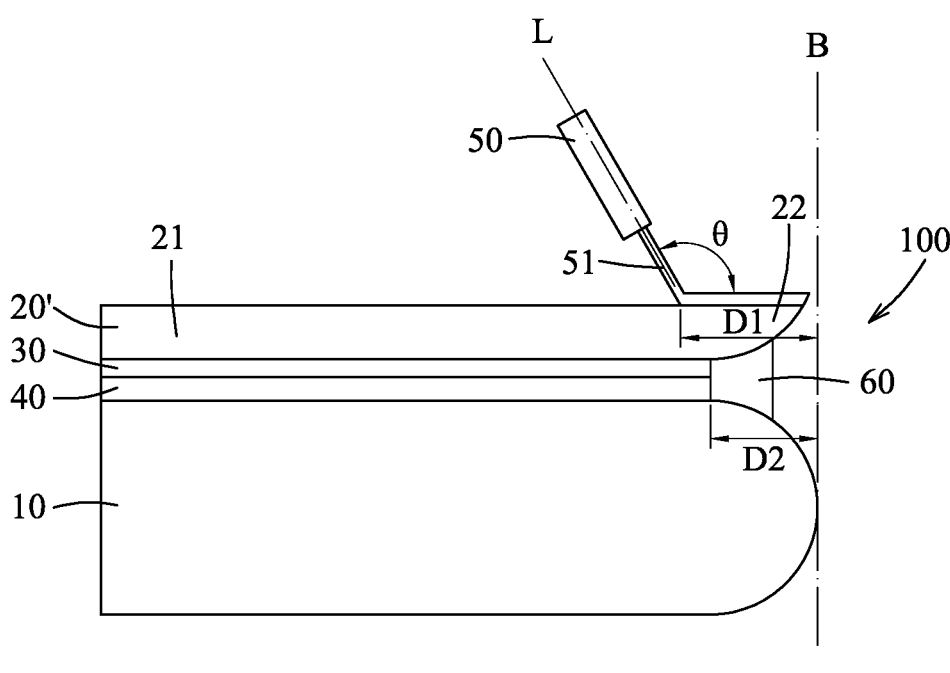

In addition, the nozzle 50 has an outlet orifice 52, (see FIGS. 5F and 5G), such that the chemical fluid 51 is directed to flow along a flow line (L) via the outlet orifice 52. As shown in FIG. 5A, an included angle ($\theta$) is formed between the flow line (L) and the planarized upper surface. FIG. 5D is a view similar to that of FIG. 5A, but illustrating an included angle ($\theta$) different from that shown in FIG. 5A. In some embodiments, the included angle ($\theta$) may range from about 90° to about 160°. In some embodiments, a dimension of the outlet orifice 52 of the nozzle 50 ranges from about 0.1 mm to about 1.0 mm. In some embodiments, a flow rate of the chemical fluid 51 ranges from about 3 mL/min to about 50 mL/min. By virtue of the precise positioning of the nozzle 50, in addition to the abovementioned parameters regarding flowing condition of the chemical fluid 51, the method disclosed in the present disclosure is capable of removing the edge portion 22, leaving the main portion 21 of the device substrate 20' with a sharp contour.

In some embodiments, the removal of the edge portion 22 using the chemical fluid 51 is conducted at a temperature ranging from about room temperature to about 70° C. for a time period ranging from about 30 s to about 3000 s, such as, but not limited to, 155 s. The chemical fluid 51 is a wet etchant, i.e., the edge portion 22 is removed by a wet etching process. In some embodiments, the chemical fluid 51 may be an acid chemical, a base chemical, or a combination thereof.

Examples of the acid chemical are, but not limited to, hydrogen fluoride (HF), nitric acid ($HNO_3$), phosphoric acid ($H_3PO_4$), sulfuric acid ($H_2SO_4$), acetic acid ($CH_3COOH$), or combinations thereof. In some cases, the acid chemical includes at least HF and $HNO_3$. In other cases, the acid chemical includes one of $H_3PO_4$, $H_2SO_4$, $CH_3COOH$, or combinations thereof, in addition to HF and $HNO_3$. In an exemplary embodiment, the chemical fluid 51 is an acid chemical including HF, $HNO_3$ and $CH_3COOH$. HF is present in an amount ranging from about 1 weight % (wt %) to about wt % based on 100 wt % of the chemical fluid 51. $HNO_3$ is present in an amount ranging from about 1 wt % to about 30 wt % based on 100 wt % of the chemical fluid 51. $CH_3COOH$ is present in an amount ranging from about 0 wt % to about 60 wt % based on 100 wt % of the chemical fluid 51. Deionized water makes up the remainder, if any, based on 100 wt % of the chemical fluid 51. When the device substrate 20' is subjected to an etching process using the chemical fluid 51, the device substrate 20' may be etched at different etching rate by adjusting wt % ratio among different chemical species in the chemical fluid 51. Other chemical species suitable for serving as the acid chemical are within the contemplated scope of the present disclosure.

In some embodiments, examples of the base chemical are, but not limited to, potassium hydroxide (KOH), tetramethylammonium hydroxide (TMAH), tetrabutylammonium hydroxide (TBAH), tetraethylammonium hydroxide (TEAH), ammonium hydroxide ($NH_4OH$), or combinations thereof. In some embodiments, each of the species may be present in an amount ranging from about 1 wt % to about 50 wt % based on 100 wt % of the chemical fluid 51. Deionized water makes up the remainder, if any, based on 100 wt % of the chemical fluid 51. Other chemical species suitable for serving as the base chemical are within the contemplated scope of the present disclosure.

In some other embodiments, in which the chemical fluid 51 is a combination of both the acid chemical and the base chemical, the acid chemical and the base chemical are employed in a stepwise manner. For example, the acid chemical may be first used, followed by the base chemical.

One may decide to adopt the acid chemical, or the base chemical, or a combination thereof as the chemical fluid 51 according to practical needs. For instance, when the device substrate 20' including silicon is subjected to the wet etching process using the acid chemical as the chemical fluid 51, such device substrate 20' may be etched at a relatively high etching rate, and the removal of edge portion 22 may be completed within a short period of time. Yet, considering that in some cases, where both the device substrate 20' and the carrier substrate 10 are made of silicon and thus are liable to be damaged by the chemical fluid 51, while this step aims to remove mainly the edge portion 22 of the device substrate 20' but not the carrier substrate 10, it is important to protect the carrier substrate 10 from damage due to the chemical fluid 51. One way is to increase etching selectivity of the chemical fluid 51 over the device substrate 20', and details will be further discussed in the following paragraphs.

When the device substrate 20' and the carrier substrate 10' are subjected to the wet etching process using the chemical fluid 51 (no matter the case of using the acid chemical or the base chemical as the chemical fluid 51), it is found that the device substrate 20' having a dopant concentration higher than that of the carrier substrate 10 will be etched at an etching rate higher than that of the carrier substrate 10. The dopant may be, for example but not limited to, boron. Therefore, by adjusting dopant concentration of the device substrate 20' to be higher than the dopant concentration of the carrier substrate 10, the chemical fluid may have a higher etching selectivity on the device substrate 20' than the carrier substrate 10. In some embodiments, when the device substrate 20' is relatively heavily doped, e.g., with a dopant concentration ranging from about $1\times10^{18}$ atom/cm 3 to about $1\times10^{21}$ atom/cm 3, and the carrier substrate 10 is relatively lightly doped, e.g., with a dopant concentration ranging from about $1\times10^{14}$ atom/cm 3 to about $1\times10^{17}$ atom/cm 3, it is noted that the chemical fluid 51 exhibits a higher etching selectivity on the heavily doped device substrate 20' than the carrier substrate 10. For instance, in some embodiments, the device substrate 20' may be etched by the chemical fluid 51 at an etching rate ranging from about 100 nm/min to about 20 μm/min, and the carrier substrate 10 may be etched by the chemical fluid 51 at an etching rate ranging from about 0 μm/min to about 0.1 μm/min. Such higher etching selectivity may effectively protect the carrier substrate 10 from being over damaged by the chemical fluid 51.

Apart from adjusting dopant concentration of the carrier substrate 10, in some embodiments, prior to sub-step (iii), a protective layer 70 is formed to cover an edge of the carrier substrate 10, so as to prevent the carrier substrate 10 from damage due to etching by the chemical fluid 51. FIG. 5E is similar to FIG. 5B, except that the protective layer 70 is formed on the edge of the carrier substrate 10.

In some embodiments, the protective layer 70 may include silicon oxides, or a carbon-including material. The carbon-including material may be represented by a chemical formula of $C_xH_y$, wherein x ranges from 1 to 6, and y ranges from 4 to 14. Examples of the carbon-including material are alkane, alkene or alkyne. In some exemplary embodiments, the carbon-including material is $C_2H_6$. Other suitable materials for forming the protective layer 70 are within the contemplated scope of the present disclosure. In some embodiments, the protective layer 70 includes silicon dioxide. The protective layer 70 may have a thickness ranging from about 3 nm to about 1 μm. The protective layer 70 may be formed by, for example, but not limited to, CVD, or spin coating. Other processes suitable for forming the protective layer 70 are within the contemplated scope of the present disclosure. Such protective layer 70 may be removed, or may be retained after step 104. By forming the protective layer 70, it is not necessary to prepare carrier substrate 10 and the device substrate 20' having different dopant concentration.

In sub-step (iv), the semiconductor structure 100 is rinsed with deionized water so as to remove any residue of the chemical fluid 51 on the semiconductor structure 100. The rinsing process may be conducted at a temperature ranging from about 10° C. to about for a time period ranging from about 10 s to about 60 s. Other processes and/or materials suitable for removing residue of the chemical fluid 51 are within the contemplated scope of the present disclosure.

In sub-step (v), the semiconductor structure 100 is subjected to a drying process. In some embodiments, the drying process may be, for example, but not limited to, a spin drying process. The rotational speed may range from about 30 rpm to about 1500 rpm for a time period ranging from about 10 s to about 60 s. In other embodiments, the drying process may be an isopropyl alcohol (IPA) drying process. Other suitable processes for drying the semiconductor structure 100 are within the contemplated scope of the present disclosure.

Figure 5F:
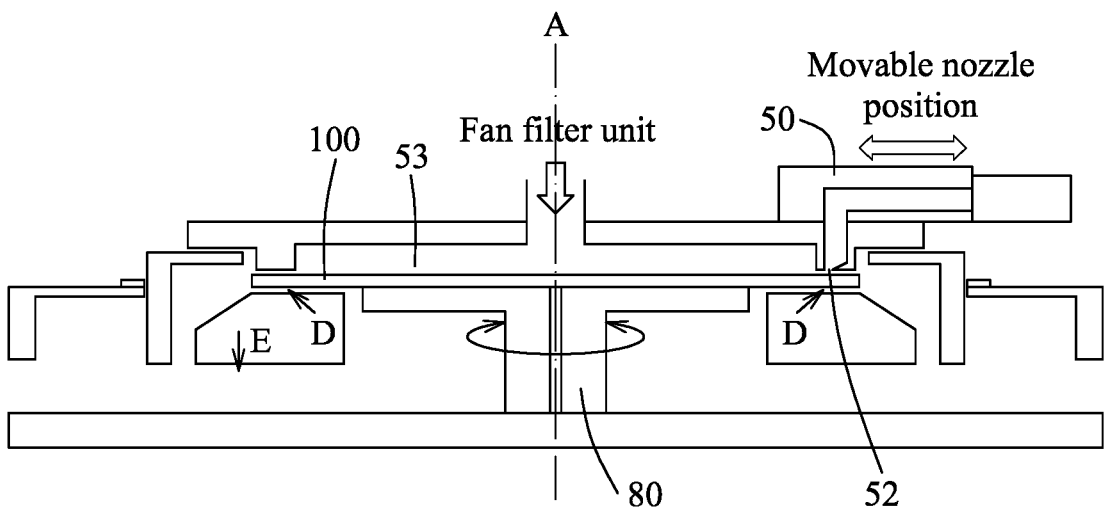

FIG. 5F provides a schematic view of a system adopted to perform step 104 in which the semiconductor structure 100 is shown, and some components therein are not drawn for the sake of brevity. The system includes a chamber 53 that accommodates the semiconductor structure 100 on the structure retainer 80. The semiconductor structure 100 is set to rotate with the structure retainer 80 around the rotation axis (A). The nozzle can be actuated to move so as to precisely adjust position thereof. In sub-step (i), the outlet orifice 52 of the nozzle 50 is aligned on a point on the peripheral region of the planarized upper surface of the device substrate 20' of the semiconductor structure 100 (see also FIGS. 5A and 5D). Therefore, by rotating the semiconductor structure 100, the chemical fluid 50 can be directed to impinge and etch the peripheral region in sub-step (iii), or the deionized water can be directed to rinse the etched semiconductor structure 100 in sub-step (iv). The system also includes a fan filter unit to supply air or in some embodiments, nitrogen gas to avoid oxidation of silicon material in the device substrate and/or the carrier substrate 10 of the semiconductor structure 100 (see also FIGS. 5A and 5D), but are not limited thereto. The system also includes a nitrogen gas supply unit for supplying nitrogen gas flow (denoted by arrows (D) in FIG. 5F) around a peripheral region of a bottom surface of the semiconductor structure 100. In some embodiments, the nitrogen gas supply unit has two outlets set across a diameter of the semiconductor structure 100. Such configuration may avoid any contaminant reaching the main portion 21 of the device substrate 20', since step 104 aims to remove mainly the edge portion 22. The system also include an exhaust gas evacuation unit, so that any exhaust gas generated during step 104 may be evacuated therethrough in a direction denoted by an arrow (E) in FIG. 5F.

Figure 5G:
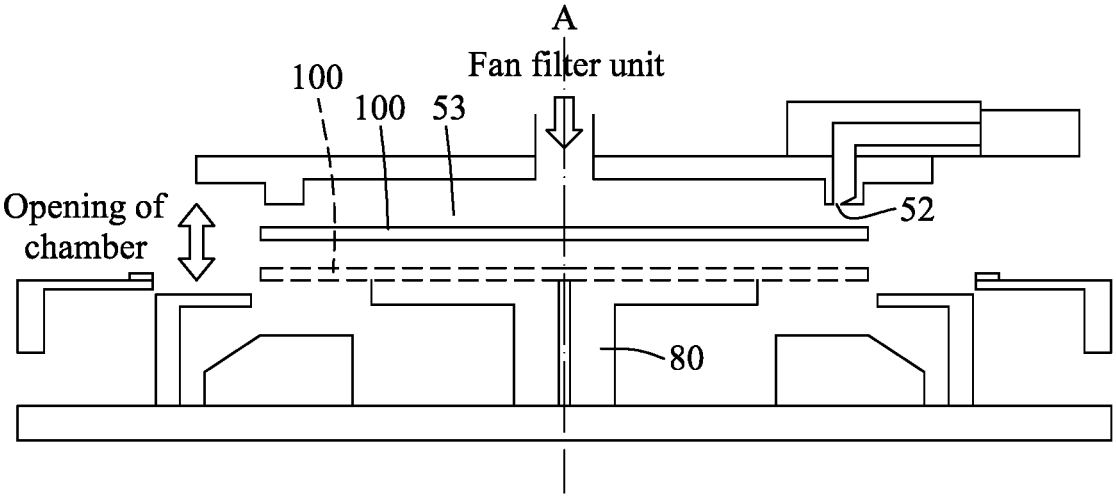

FIG. 5G is a view similar to that of FIG. 5F, but illustrating the system after completing step 104. After completing the drying process, the chamber 53 is opened so as to permit the semiconductor structure 100 on the structure retainer 80 to be moved from a lower position, where the semiconductor structure 100 is represented by dotted lines, to an upper position, where the semiconductor structure 100 is represented by solid lines, to thereby take out the semiconductor structure 100. It should be noted that other systems suitable for performing step 104 are within the contemplated scope of the present disclosure.

During step 104, the edge portion 22 of the device substrate 20' is removed by the chemical fluid 51, the semiconductor device 30 is unlikely to be affected by the chemical fluid 51, and the carrier substrate 10 is well protected by either being lightly doped (relative to the device substrate 20') or being covered by the protective layer 70, and thus, the semiconductor device 30 and the carrier substrate 10 may remain substantially intact. In comparison with a mechanical trimming process for removal of the edge portion 22, the device substrate 20' is less likely to peel off when the edge portion 22 is removed using the chemical fluid 51.

Figure 6A:
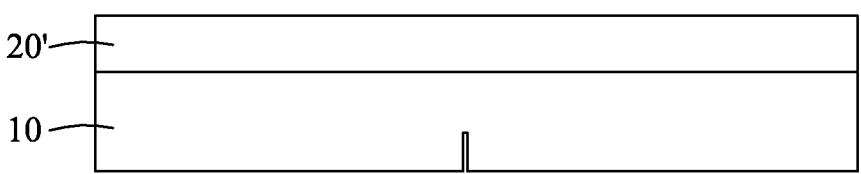
Figure 6B:
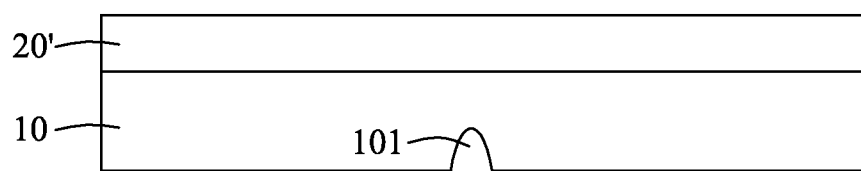

FIG. 6A shows an edge portion of the carrier substrate 10 in accordance with some embodiments. FIG. 6B is a view similar to that of FIG. 6A, but illustrating another edge portion of the carrier substrate 10 which includes a notch 101 on the edge portion. It is noted that the edge portion with or without the notch 101 is substantially not affected by the chemical fluid 51 during removal of the edge portion 22 of the device substrate 20', and remains intact on the carrier substrate 10. The retainment of the notch 101 is conducive to providing alignment of the carrier substrate 10 in other steps to be performed subsequently, if any, or in further application of the semiconductor structure 100.

In some embodiments, step 104 may further include a sub-step (vi) to remove the sealing element 60 shown in FIGS. 5A and 5D. In some embodiments, the sealing element 60 is removed by, for instance, but not limited to, a sulfuric peroxide mix (SPM) clean process, in which a mixture of sulfuric acid and hydrogen peroxide is used. Other processes and/or materials suitable for removing the sealing element 60 are within the contemplated scope of the present disclosure.

After completing step 104, the treated semiconductor structure 100 may be further processed to be utilized in different applications. The following paragraphs provide an exemplary embodiment of further processing and application of the treated semiconductor structure 100, in which the semiconductor device 30 is a GAA nanosheet device (see FIG. 9A). Other further processing and/or applications of the treated semiconductor structure 100 are within the contemplated scope of the present disclosure.

Figure 7:
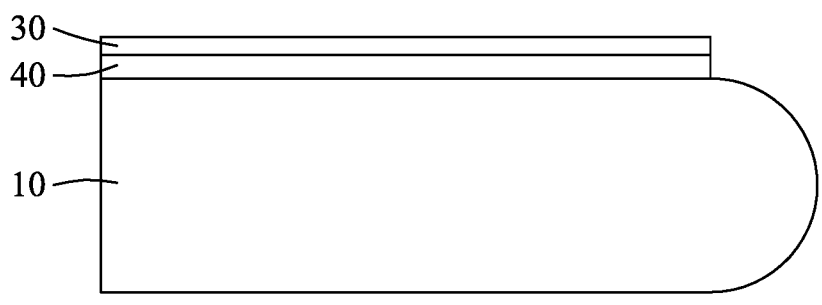
Figure 8A:
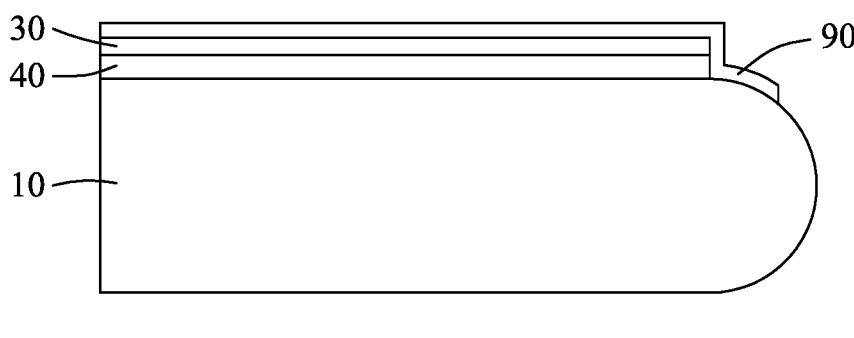
Figure 8B:
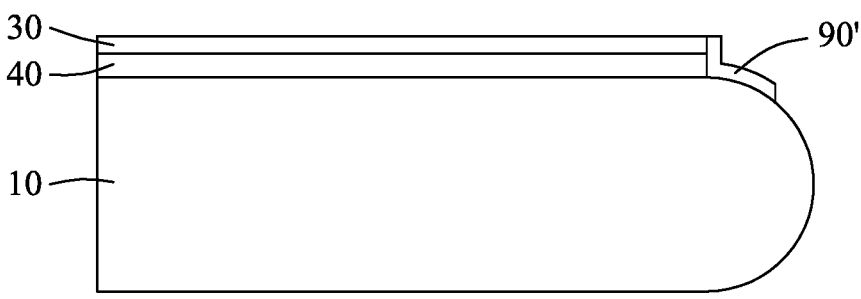

FIGS. 7 to 8B illustrate schematic views of intermediate stages of the further processing of the semiconductor structure 100 shown in FIG. 5B, so as to obtain a structure shown in FIG. 9A. Referring to the examples illustrated in FIGS. 5B, 7 and 9A, the device substrate 20' (see FIGS. 5B and 7)

is removed until shallow trench isolation (STI) sections 31 are exposed, and semiconductor sections 32 which alternate with the STI sections 31 are also exposed (see FIG. 9A). Examples of a material for the semiconductor sections 32 may be similar to those for the device substrate 20, and the semiconductor sections 32 may be made of a material the same as or different from that of the device substrate 20.

In some embodiments, the removal of the device substrate 20' includes a plurality of etching processes and/or planarization processes that are performed in a stepwise manner. In each of the etching process or planarization process, a portion of the device substrate 20' is removed, and a thickness of the device substrate 20' is further reduced. Examples of the etching processes are, for example but not limited to, dry etching and/or wet etching. Example of the planarization process is, for example, but not limited to, a chemical-mechanical planarization (CMP) process. In some embodiments, the planarization process is employed so as to remove the device substrate 20' in a short period of time. In other embodiments, dry etching is employed so as to remove the device substrate 20' at a fair speed and a fair uniformity over the etched surface. In yet other embodiments, wet etching is employed so as to obtain a good uniformity over the etched surface. The wet etchant may include the acid chemical and/or the base chemical as mentioned above. Other suitable processes for removing the device substrate 20' are within the contemplated scope of the present disclosure.

Referring to the examples illustrated in FIGS. 7 and 8A, an oxide layer 90 is formed over the structure shown in FIG. 7. In some embodiments, the oxide layer 90 includes, for example, but not limited to silicon oxides, such as silicon dioxide. In some embodiments, the oxide layer 90 is formed by, for example, but not limited to, an atomic layer deposition (ALD) process. The oxide layer 90 formed by ALD process is found to have a good conformality. Other materials or methods suitable for forming the oxide layer 90 are within the contemplated scope of the present disclosure.

Referring to the example illustrated in FIGS. 8A and 8B, a planarization process is performed to remove the oxide layer 90 that is located on an upper surface of the semiconductor device 30, leaving the remaining oxide layer, denoted by the reference numeral 90', that is located on a sidewall of the semiconductor device 30, a sidewall of the bonding layer 40, and an upper surface of the carrier substrate 10. In some embodiments, the planarization process is a CMP process. Other methods suitable for the partial removal of the oxide layer 90 are within the contemplated scope of the present disclosure.

After the planarization process, the semiconductor device (i.e., the GAA nanosheet device) 30 is exposed. FIG. 9A is a fragmentary perspective view of the semiconductor structure 100 after the planarization process, in which the oxide layer 90' is omitted for the sake of brevity. As shown in FIG. 9A, the GAA nanosheet device 30 includes the STI sections 31 and the semiconductor sections 32 in an upper part of the GAA nanosheet device 30. The GAA nanosheet device 30 further includes a GAA nanosheet structure 33, a MEOL section 34 and a BEOL section 35 that are sequentially disposed beneath the STI sections 31 and the semiconductor sections 32 in such order. The GAA nanosheet structure 33 includes a plurality of active portions 33A respectively beneath the semiconductor sections 32, and a plurality of dummy fins 33B respectively beneath the STI sections 31. The dummy fins 33B may include any suitable dielectric materials. Each of the active portions 33A includes a plurality of source/drain regions 331 and a plurality of stack regions 332 disposed to alternate with the source/drain regions 331. Source/drain region(s) may refer to a source or a drain, individually or collectively dependent upon the context. The source/drain regions 331 may include an epitaxial semiconductor material doped with impurities. Each of the stack regions 332 includes a plurality of channel layers 333 each interconnecting two adjacent ones of the source/drain regions 331, a plurality of gate features 334 alternating with the channel layers 333, and a dielectric region 330 disposed on an upmost one of the gate features 334. The channel layers 333 may include, for example, silicon, but not limited thereto. The dielectric region 330 may include, for example, silicon nitride, but not limited thereto. Each of the gate features 334 has a gate electrode 335, a gate dielectric 336 surrounding the gate electrode 335, two inner spacers 337 disposed to separate the gate electrode 335 and the gate dielectric 336 from being in contact with two adjacent ones of the source/drain regions 331. The gate electrode 335 may include aluminum, tungsten, copper, other suitable materials, or combinations thereof. The gate dielectric 336 and the inner spacers 337 may each include silicon oxide, silicon nitride, silicon oxynitride, high dielectric constant (k) materials, other suitable materials, or combinations thereof. Other suitable materials and processes for forming the GAA nanosheet structure 33 are within the contemplated scope of the present disclosure.

The semiconductor structure 100 shown in FIG. 9A may be further subjected to a patterning process (see FIG. 9B), a re-fill process (see FIG. 9C), and a replacement process (see FIGS. 9D and 9E) in sequence. FIGS. 9B to 9E are partially enlarged views of FIG. 9A but illustrating the structures respectively after these processes.

Figure 9C:
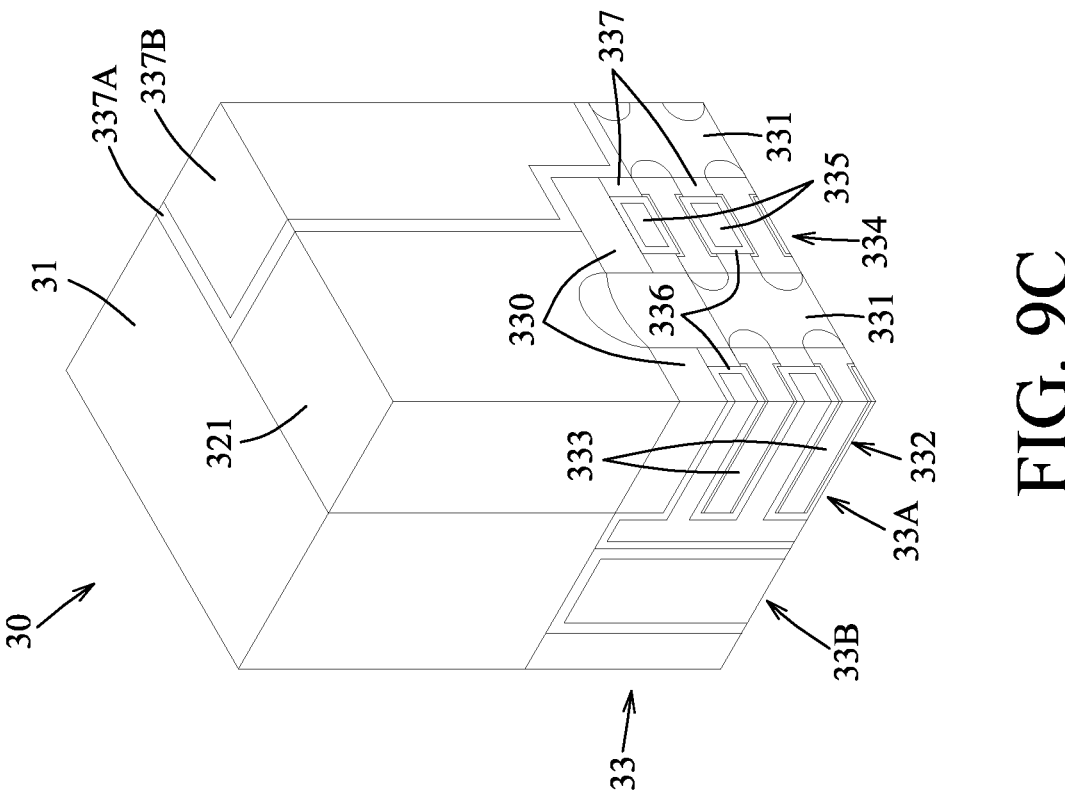
Figure 9B:
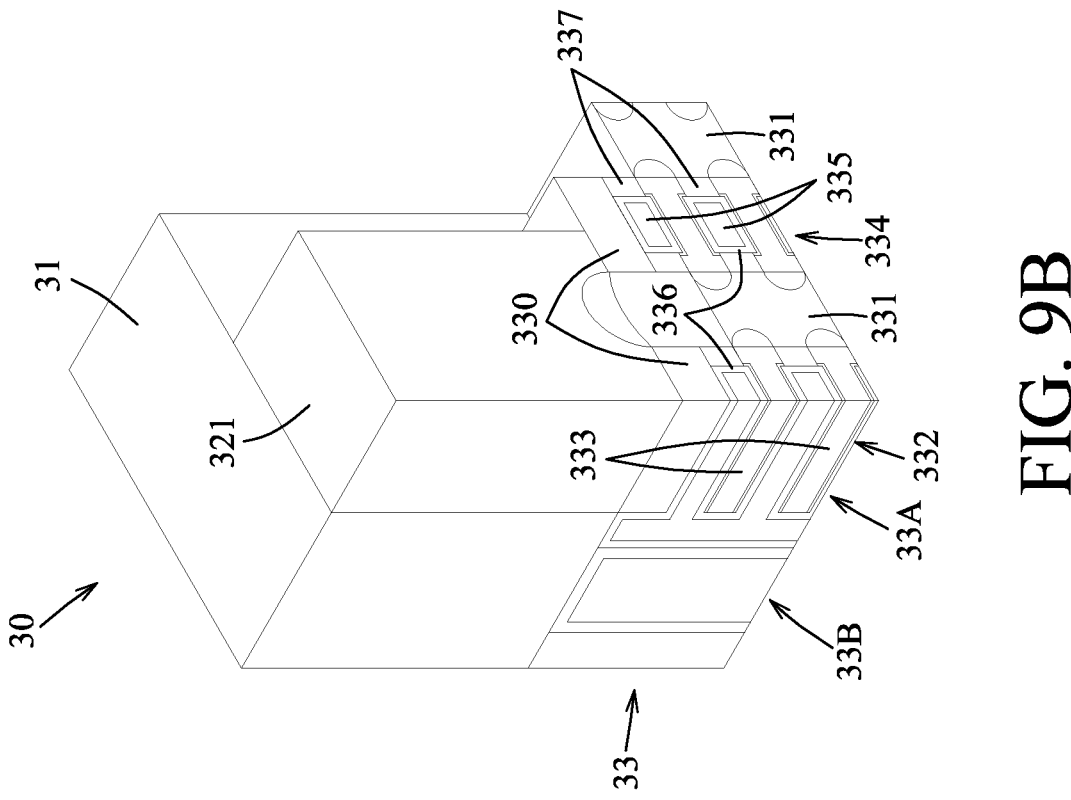

Referring to FIGS. 9A and 9B, in the patterning process, at least one of the semiconductor sections 32 is patterned to form a patterned semiconductor section 321 covering at least one of the source/drain portion 331 of a corresponding one of the active portions 33A. In some embodiments, the patterning process may include: (i) forming a patterned mask layer (not shown) to cover a top surface of the structure shown in FIG. 9A, the patterned mask layer being a patterned photoresist or a patterned hard mask and having at least one opening corresponding in position to the patterned semiconductor section 321; (ii) etching the at least one of the semiconductor sections 32 through the opening of the patterned mask layer using dry etching, wet etching, other suitable processes, or combinations thereof, to expose the element(s) beneath the at least one of the semiconductor sections 32; and (iii) removing the patterned mask layer. Other suitable patterning processes are within the contemplated scope of the present disclosure.

Referring to FIG. 9C, in the re-fill process, first and second dielectric materials are sequentially deposited over the structure shown in FIG. 9B using CVD, physical vapor deposition (PVD), ALD or other suitable processes, followed by planarization using, for example, but not limited to, CMP, so that the first and second dielectric materials are respectively formed into a first dielectric layer 337A and a second dielectric layer 337B. The first and second dielectric layers 337A, 337B may be made of different dielectric materials. For example, the first dielectric layer 337A is made of silicon nitride, and the second dielectric layer 337B is made of silicon oxide. Other suitable materials and processes for the re-fill processes are within the contemplated scope of the present disclosure.

Figure 9E:
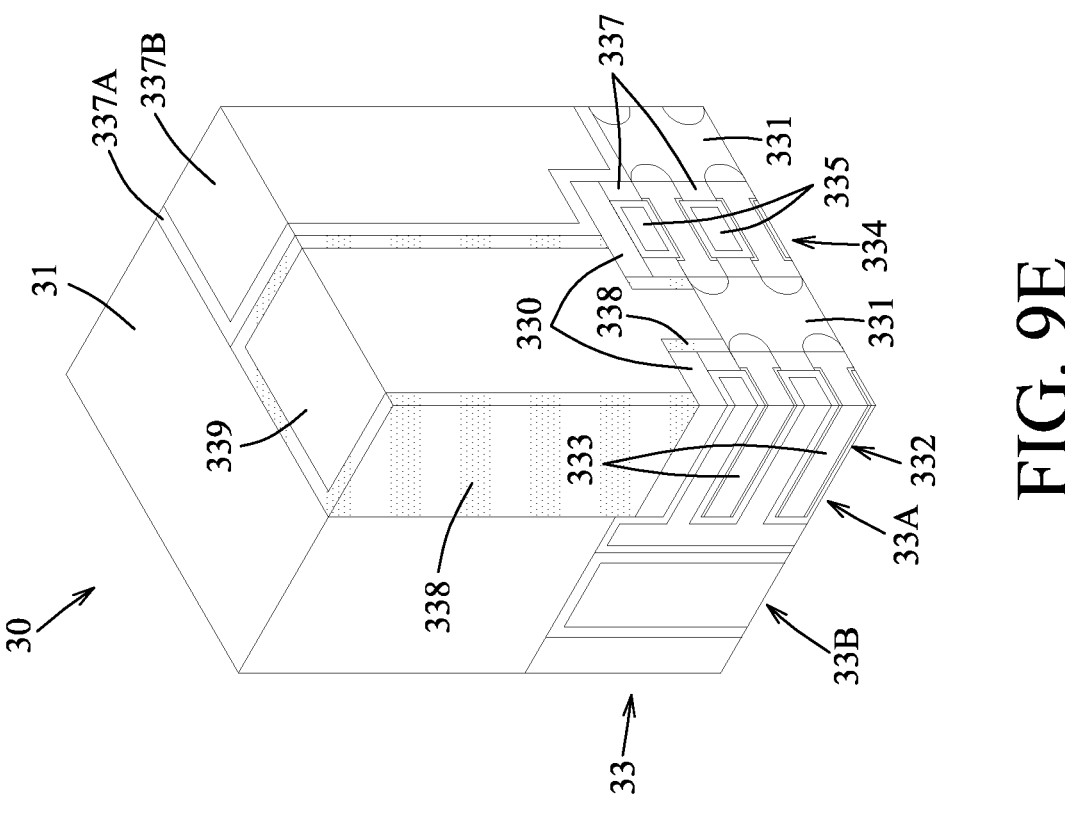
Figure 9D:
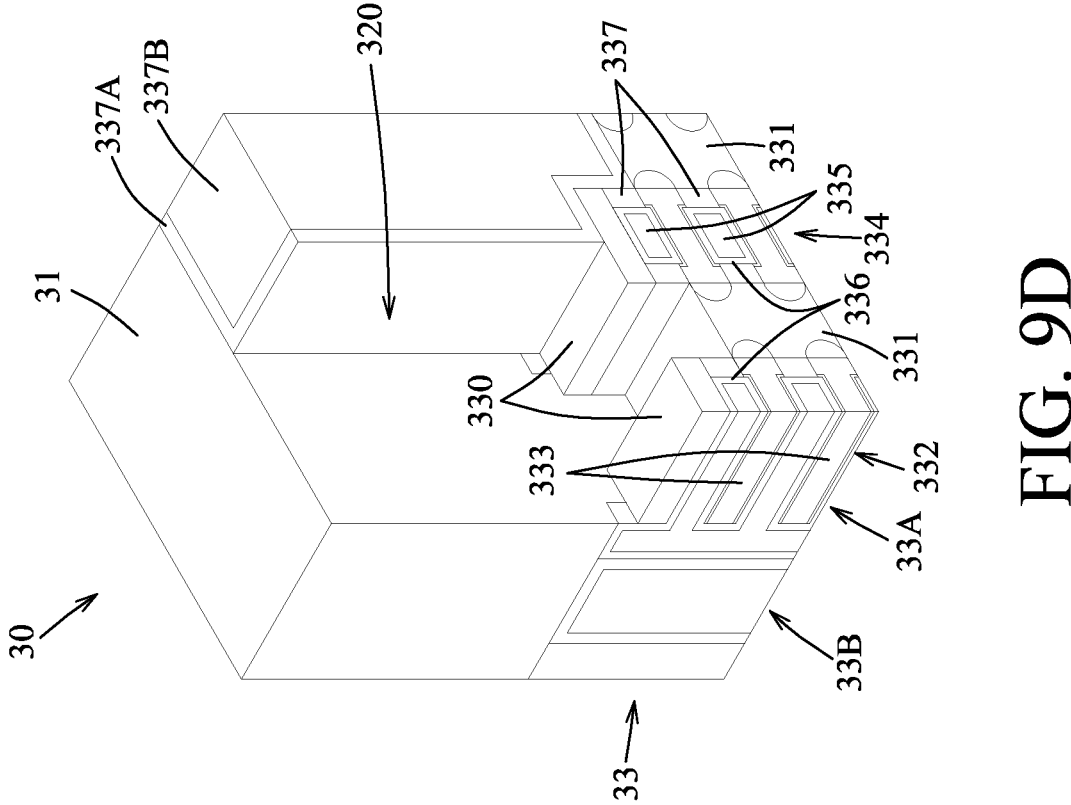

Referring to FIGS. 9D and 9E, in the replacement process, the patterned semiconductor section 321 is replaced with a barrier layer 338 and a via contact 339 (the dotted lines shown in FIG. 9A represent the positions where the barrier layer 338 and the via contacts 339 may be formed). In some embodiments, the replacement process includes: (i) removing the patterned semiconductor section 321 using dry etching, wet etching, other suitable processes, or combinations thereof, to form a cavity 320 which exposes the at least one of source/drain portion 331 of the corresponding active portion 33A; (ii) conformally forming a silicon nitride redeposition (SNR) layer for forming the barrier layer 338 over the structure with the patterned semiconductor section 321 removed, using, for example, but not limited to, CVD; (iii) selectively removing the SNR layer using, for example, but not limited to, antistrophic etching, to remove the SNR layer on upper surfaces of the STI sections 31 and the first and second dielectric layers 337A, 337B and on a bottom of the cavity 320, thereby leaving the barrier layer 338 on inner sidewall surfaces of the cavity 320; (iv) conformally depositing a metal material (for example, but not limited to, ruthenium (Ru)) for forming the via contact 339 over the structure formed with the barrier layer 338, using, for example, PVD or other suitable process; and (v) performing a planarization process to remove an excess of the metal material to thereby obtain the via contact 339. Other suitable replacement processes are within the contemplated scope of the present disclosure.

In some exemplary embodiments, the semiconductor structure 100 treated in accordance to the method of the present disclosure is further processed to be applied in the field of GAA nanosheet device. Other suitable further processes and/or application of the semiconductor structure 100 are within the contemplated scope of the present disclosure.

The embodiments of the present disclosure have the following advantageous features. The edge portion of the device substrate is removed by a wet etching process using the chemical fluid. By using a wet etching process, peeling of the device substrate is unlikely to happen on the main portion remaining in the device substrate. In addition, the carrier substrate may be well protected from damage caused by the chemical fluid. By virtue of controlling dopant concentration of the carrier substrate to be lower than that of the device substrate, the chemical fluid has an etching selectivity on the device substrate higher than that of the carrier substrate, so that the carrier substrate may remain intact. The protective layer may also effectively protect the carrier substrate. Furthermore, since the semiconductor device is substantially not affected by the chemical fluid, any metal e.g., copper, within the semiconductor device is not exposed, so as to effectively prevent any potential contamination of the other components in the semiconductors structure due to diffusion of copper. Additionally, low k materials within the semiconductor device are not exposed, and thus may be free from potential damages caused by any further processing, e.g., dry etching, performed on the semiconductor structure.

In accordance with some embodiments of the present disclosure, a method for treating a semiconductor structure includes: forming the semiconductor structure which includes a carrier substrate, a device substrate, a semiconductor device formed on the device substrate, and a bonding layer formed to bond the semiconductor device with the carrier substrate, the device substrate having an upper surface which is faced upwardly, and which is opposite to semiconductor device; and directing a chemical fluid to impinge the upper surface of the device substrate so as to remove an edge portion of the device substrate.

In accordance with some embodiments of the present disclosure, the carrier substrate and the device substrate are doped by a dopant in different dopant concentration, and the chemical fluid has a higher etching selectivity over the device substrate than the carrier substrate.

In accordance with some embodiments of the present disclosure, the dopant is a p-type impurity.

In accordance with some embodiments of the present disclosure, a dopant concentration of the device substrate ranges from $1 \times 10^{18}$ atom/cm$^3$ to $1 \times 10^{21}$ atom/cm$^3$.

In accordance with some embodiments of the present disclosure, a dopant concentration of the carrier substrate ranges from $1 \times 10^{14}$ atom/cm$^3$ to $1 \times 10^{17}$ atom/cm$^3$.

In accordance with some embodiments of the present disclosure, the chemical fluid includes an acid chemical.

In accordance with some embodiments of the present disclosure, the acid chemical includes hydrogen fluoride (HF), nitric acid (HNO$_3$), phosphoric acid (H$_3$PO$_4$), sulfuric acid (H$_2$SO$_4$), acetic acid (CH$_3$COOH), or combinations thereof.

In accordance with some embodiments of the present disclosure, the chemical fluid includes a base chemical.

In accordance with some embodiments of the present disclosure, the base chemical includes potassium hydroxide (KOH), tetramethylammonium hydroxide (TMAH), tetrabutylammonium hydroxide (TBAH), tetraethylammonium hydroxide (TEAH), ammonium hydroxide (NH$_4$OH), or combinations thereof.

In accordance with some embodiments of the present disclosure, a method for treating a semiconductor structure includes: forming the semiconductor structure which includes a carrier substrate, a device substrate, a semiconductor device formed on the device substrate, and a bonding layer formed to bond the semiconductor device with the carrier substrate, the device substrate having a proximate surface and a distal surface relative to the carrier substrate; performing a planarization process over the distal surface of the device substrate, so that the planarized device substrate has a planarized surface opposite to the proximate surface, and includes a main portion and an edge portion surrounding the main portion; and removing the edge portion of the planarized device substrate using a chemical fluid.

In accordance with some embodiments of the present disclosure, the chemical fluid includes a wet etchant.

In accordance with some embodiments of the present disclosure, wherein removal of the edge portion of the planarized device substrate includes: retaining the semiconductor structure on a structure retainer in a manner that the planarized device substrate is faced upwardly; rotating the semiconductor structure with the structure retainer; and directing the chemical fluid through a nozzle so as to impinge a peripheral region of the planarized surface.

In accordance with some embodiments of the present disclosure, the semiconductor structure is rotated about a rotation axis normal to the planarized surface; a reference line, which is tangent to an edge of the carrier substrate, is parallel to the rotational axis; a first distance is a distance between the reference line and a point on the device substrate at which the chemical fluid reaches the device substrate from the nozzle; a second distance is a minimal distance between the semiconductor device and the reference line; and the first distance is larger than the second distance.

In accordance with some embodiments of the present disclosure, the chemical fluid is directed to flow along a flow line, an included angle between the flow line and the planarized surface ranges from 90° to 160°.

In accordance with some embodiments of the present disclosure, a flow rate of the chemical fluid ranges from 3 mL/min to 50 mL/min.

In accordance with some embodiments of the present disclosure, a dimension of the outlet orifice of the nozzle ranges from 0.1 mm to 1.0 mm.

In accordance with some embodiments of the present disclosure, before performing the planarization process, a sealing element is formed to cover a surface of the semiconductor device exposed from the carrier substrate and the device substrate.

In accordance with some embodiments of the present disclosure, a semiconductor structure includes: a carrier substrate; a device substrate which has a dopant concentration different from that of the carrier substrate; a semiconductor device disposed between the carrier substrate and the device substrate; and a bonding layer disposed between the semiconductor device and the carrier substrate.

In accordance with some embodiments of the present disclosure, each of the carrier substrate and the device substrate is independently doped with a p-type impurity, and the dopant concentration of the device substrate is higher than that of the carrier substrate.

In accordance with some embodiments of the present disclosure, the dopant concentration of the device substrate ranges from $1\times10^{18}$ atom/cm$^3$ to $1\times10^{21}$ atom/cm$^3$, and the dopant concentration of the carrier substrate ranges from $1\times10^{14}$ atom/cm$^3$ to $1\times10^{17}$ atom/cm$^3$.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for treating a semiconductor structure, comprising:
  forming the semiconductor structure which includes a carrier substrate, a device substrate, a semiconductor device formed on the device substrate, and a bonding layer formed to bond the semiconductor device with the carrier substrate, the device substrate having an upper surface which is faced upwardly, and which is opposite to the semiconductor device, each of the device substrate and the carrier substrate including a main portion and an edge portion surrounding the main portion;
  forming a sealing element at a void that is positioned between the edge portion of the carrier substrate and the edge portion of the device substrate and that surrounds the semiconductor device and the bonding layer;
  directing a chemical fluid to impinge the upper surface of the device substrate so as to remove the edge portion of the device substrate; and
  after removal of the edge portion of the device substrate, removing the sealing element,
  wherein during impinging the device substrate using the chemical fluid, an etching rate of the device substrate is higher than an etching rate of the carrier substrate such that after removal of the edge portion of the device substrate,
  the main portion of the device substrate and the main portion of the carrier substrate remain on two opposite sides of the semiconductor device, respectively, and
  the edge portion of the carrier substrate remains and extends beyond the main portion of the device substrate and the semiconductor device.

2. The method according to claim 1, wherein the carrier substrate and the device substrate are doped by a dopant in different dopant concentrations.

3. The method according to claim 2, wherein the dopant is a p-type impurity.

4. The method according to claim 2, wherein a dopant concentration of the device substrate ranges from $1\times10^{18}$ atom/cm$^3$ to $1\times10^{21}$ atom/cm$^3$.

5. The method according to claim 2, wherein a dopant concentration of the carrier substrate ranges from $1\times10^{14}$ atom/cm$^3$ to $1\times10^{17}$ atom/cm$^3$.

6. The method according to claim 1, wherein the chemical fluid includes an acid chemical.

7. The method according to claim 6, wherein the acid chemical includes hydrogen fluoride (HF), nitric acid (HNO$_3$), phosphoric acid (H$_3$PO$_4$), sulfuric acid (H$_2$SO$_4$), acetic acid (CH$_3$COOH), or combinations thereof.

8. The method according to claim 1, wherein the chemical fluid includes a base chemical.

9. The method according to claim 8, wherein the base chemical includes potassium hydroxide (KOH), tetramethylammonium hydroxide (TMAH), tetrabutylammonium hydroxide (TBAH), tetraethylammonium hydroxide (TEAH), ammonium hydroxide (NH$_4$OH), or combinations thereof.

10. A method for treating a semiconductor structure, comprising:
  forming the semiconductor structure which includes a carrier substrate, a device substrate, a semiconductor device formed on the device substrate, and a bonding layer formed to bond the semiconductor device with the carrier substrate, the device substrate having a proximate surface and a distal surface relative to the carrier substrate;
  forming a sealing element that covers a surface of the semiconductor device exposed from the carrier substrate and the device substrate, the sealing element having an inner surface that is connected to the surface of the semiconductor device;
  performing a planarization process over the distal surface of the device substrate, so that the planarized device substrate has a planarized surface opposite to the proximate surface, and includes a main portion and an edge portion surrounding the main portion, the edge portion having an outer section connected to the sealing element, and an inner section connected to a periphery of the semiconductor device and located between the main portion and the outer section;
  directing a chemical fluid to impinge the inner section of the edge portion so as to remove the edge portion of the planarized device substrate, while the main portion of the planarized device substrate remains on the semiconductor device;
  after removing the edge portion, removing the sealing element; and after removing the sealing element, removing the main portion of the planarized device substrate until a shallow trench isolation section of the semiconductor device is exposed.

11. The method according to claim 10, wherein the chemical fluid includes a wet etchant.

12. The method according to claim 10, wherein removal of the edge portion of the planarized device substrate includes:

retaining the semiconductor structure on a structure retainer in a manner that the planarized device substrate is faced upwardly;

rotating the semiconductor structure with the structure retainer; and directing the chemical fluid through a nozzle so as to impinge a peripheral region of the planarized surface.

13. The method according to claim 12, wherein:

the semiconductor structure is rotated about a rotation axis normal to the planarized surface;

a reference line, which is tangent to an edge of the carrier substrate, is parallel to the rotational axis;

a first distance is a distance between the reference line and a point on the device substrate at which the chemical fluid reaches the device substrate from the nozzle;

a second distance is a minimal distance between the semiconductor device and the reference line; and the first distance is larger than the second distance.

14. The method according to claim 12, wherein the chemical fluid is directed to flow along a flow line, an included angle between the flow line and the planarized surface ranges from 90° to 160°.

15. The method according to claim 12, wherein a flow rate of the chemical fluid ranges from 3 mL/min to 50 mL/min.

16. The method according to claim 12, wherein a dimension of the outlet orifice of the nozzle ranges from 0.1 mm to 1.0 mm.

17. A method for treating a semiconductor structure, comprising:

forming the semiconductor structure which includes:

a carrier substrate;

a device substrate which has a dopant concentration different from a dopant concentration of the carrier substrate;

a semiconductor device disposed between the carrier substrate and the device substrate; and a bonding layer disposed between the semiconductor device and the carrier substrate;

forming a sealing element at a void that is positioned between an edge portion of the carrier substrate and an edge portion of the device substrate and that surrounds the semiconductor device and the bonding layer;

performing an etching process on the semiconductor structure by directing a chemical fluid to impinge the edge portion of the device structure, an etching rate of the device substrate being higher than an etching rate of the carrier substrate; and after the etching process, removing the sealing element, wherein after the etching process, the edge portion of the device substrate is removed and the edge portion of the carrier substrate remains.

18. The method according to claim 17, wherein each of the carrier substrate and the device substrate is doped with a p-type impurity, and the dopant concentration of the device substrate is higher than the dopant concentration of the carrier substrate.

19. The method according to claim 17, wherein the dopant concentration of the device substrate ranges from $1 \times 10^{18}$ atom/cm$^3$ to $1 \times 10^{21}$ atom/cm$^3$, and the dopant concentration of the carrier substrate ranges from $1 \times 10^{14}$ atom/cm$^3$ to $1 \times 10^{17}$ atom/cm$^3$.

20. The method according to claim 17, wherein before performing the etching process, forming a protective layer to cover the edge portion of the carrier substrate such that when performing the etching process to remove the edge portion of the device substrate, the edge portion of the carrier substrate, which is located beneath the sealing element and is protected by the protective layer, is not removed by the chemical fluid.

* * * * *